United States Patent

Noble et al.

Patent Number: 5,942,982
Date of Patent: Aug. 24, 1999

[54] SYSTEM FOR DETECTING OPEN CIRCUITS WITH A MEASUREMENT DEVICE

[75] Inventors: Robert H. Noble, Longmont; Robert B. Smith, Loveland, both of Colo.

[73] Assignee: Hewlett-Packard Company, Palo Alto, Calif.

[21] Appl. No.: 08/963,675

[22] Filed: Oct. 31, 1997

[51] Int. Cl.⁶ .................................................. G08B 21/00
[52] U.S. Cl. ........................ 340/652; 340/660; 324/500; 324/523; 324/527
[58] Field of Search ................................... 340/652, 635, 340/660; 324/500, 522, 523, 525, 527

[56] References Cited

U.S. PATENT DOCUMENTS 3,590,370   6/1971   Fleischer ................................. 340/652
5,754,114   5/1998   Gnadt ..................................... 340/649

Primary Examiner—Jeffery A. Hofsass
Assistant Examiner—Julie B. Lieu
Attorney, Agent, or Firm—Patrick J. Murphy

[57] ABSTRACT

A system for detecting open circuits is presented. The system comprises first and second digital-to-analog converters (DACs). The DACs, in combination with a microprocessor, generate a tri-state voltage which is fed through the system. This tri-state voltage is then attenuated via an amplifier. A probe carries an external attenuation signal via a measurement line through the system to be summed with the attenuated tri-state voltage to create $V_{wts}$. An analog-to-digital converter then compares $V_{wts}$ with a known signal to determine whether the circuit under test is open.

3 Claims, 13 Drawing Sheets

5,942,982

SYSTEM FOR DETECTING OPEN CIRCUITS WITH A MEASUREMENT DEVICE

FIELD OF THE INVENTION

The present invention relates generally to test and measurement instruments and more particularly to a system for detecting open circuits with a measurement device.

BACKGROUND OF THE INVENTION

Circuit testing is an important part of circuit development. There are many instruments that are available to perform the testing function, including digital multimeters, oscilloscopes and logic analyzers. With product development and introduction cycles becoming shorter, finding faults earlier in the system design and manufacturing stages is paramount.

One such test that is critical during system design and manufacturing is to determine if a circuit is "open." One means to accomplish this is to place a probe at point A in a circuit, and a second probe at point B. The resistance is then measured between points A and B and if the resistance is infinite, it can be assumed that portion of the circuit is open.

SUMMARY OF THE INVENTION

The present invention provides a system for detecting open circuits with a measurement device. The system comprises a probe providing an input signal, in combination with a tristate voltage detection circuit and a voltage cancellation circuit. More specifically, two digital-to-analog converters, controlled by a microprocessor, generate the tri-state voltage that is fed through the system. A first amplifier, using the tri-state voltage, generates an attenuated tri-state voltage which is then summed to an external attenuation signal which is brought into the system via the probe. This voltage, $V_{wts}$, is then measured by an analog-to-digital converter, which is itself controlled by the microprocessor, to determine whether the circuit is open.

DETAILED DESCRIPTION OF THE PREFERRED EMBODIMENT

Figure 1:
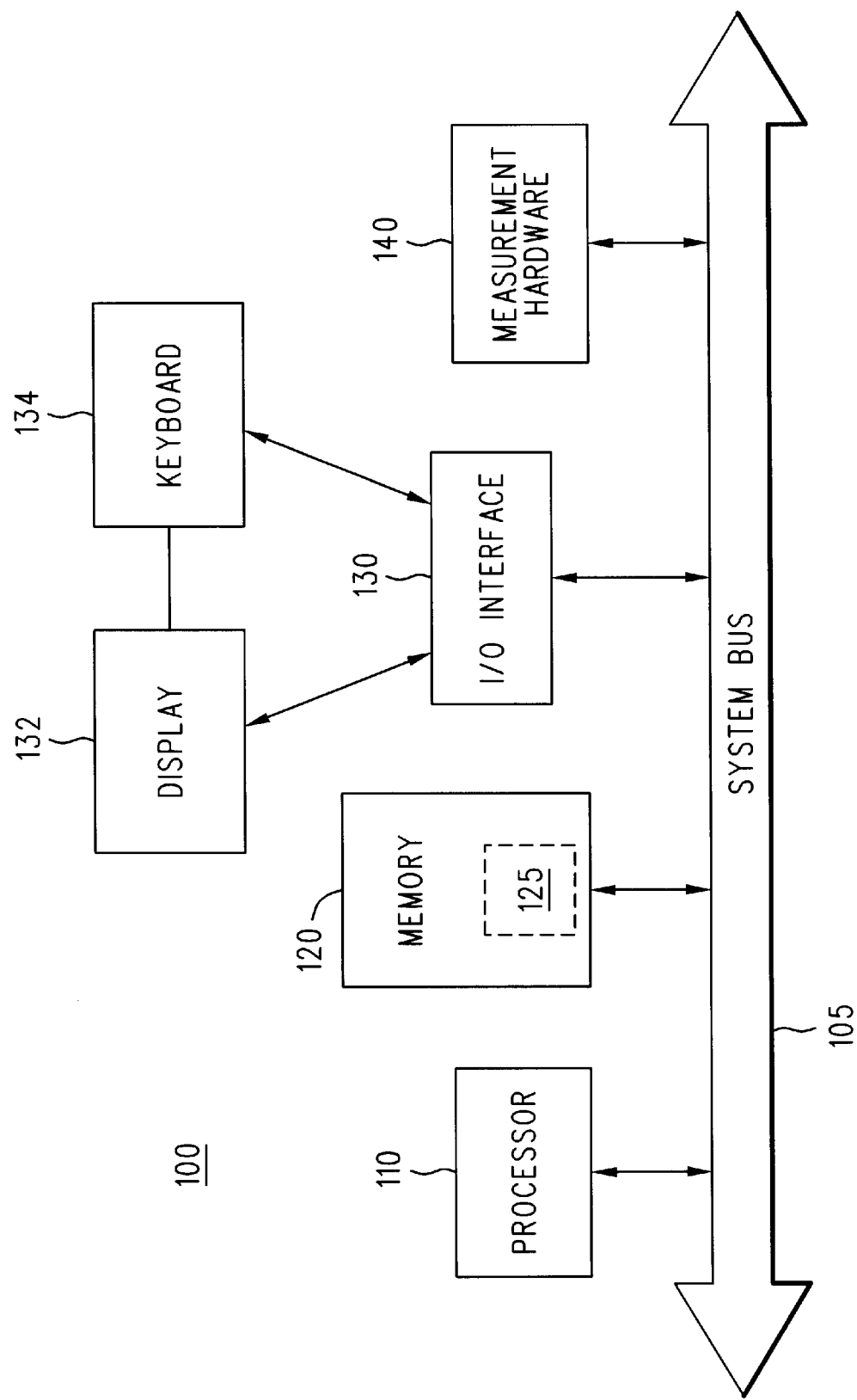
FIG. 1 shows an overall system block diagram.

FIG. 1 shows an overall system block diagram. A processing unit 110 is connected to system bus 105. In a preferred embodiment, the processing unit is an 80L188EB central processing unit available from Intel Corporation. The system bus 105 facilitates communications between the processing unit 110, memory 120, an input/output interface device 130 and measurement hardware 140. The memory 120 may store the software of the present invention as well as all data collected and generated by the present invention.

An area 125 within the memory 120 is set aside for storage of the present method which is described more fully below. The input/output interface device 130 controls data communications between the bus 105 and a display mechanism 132, and a keyboard 134.

Figure 2:
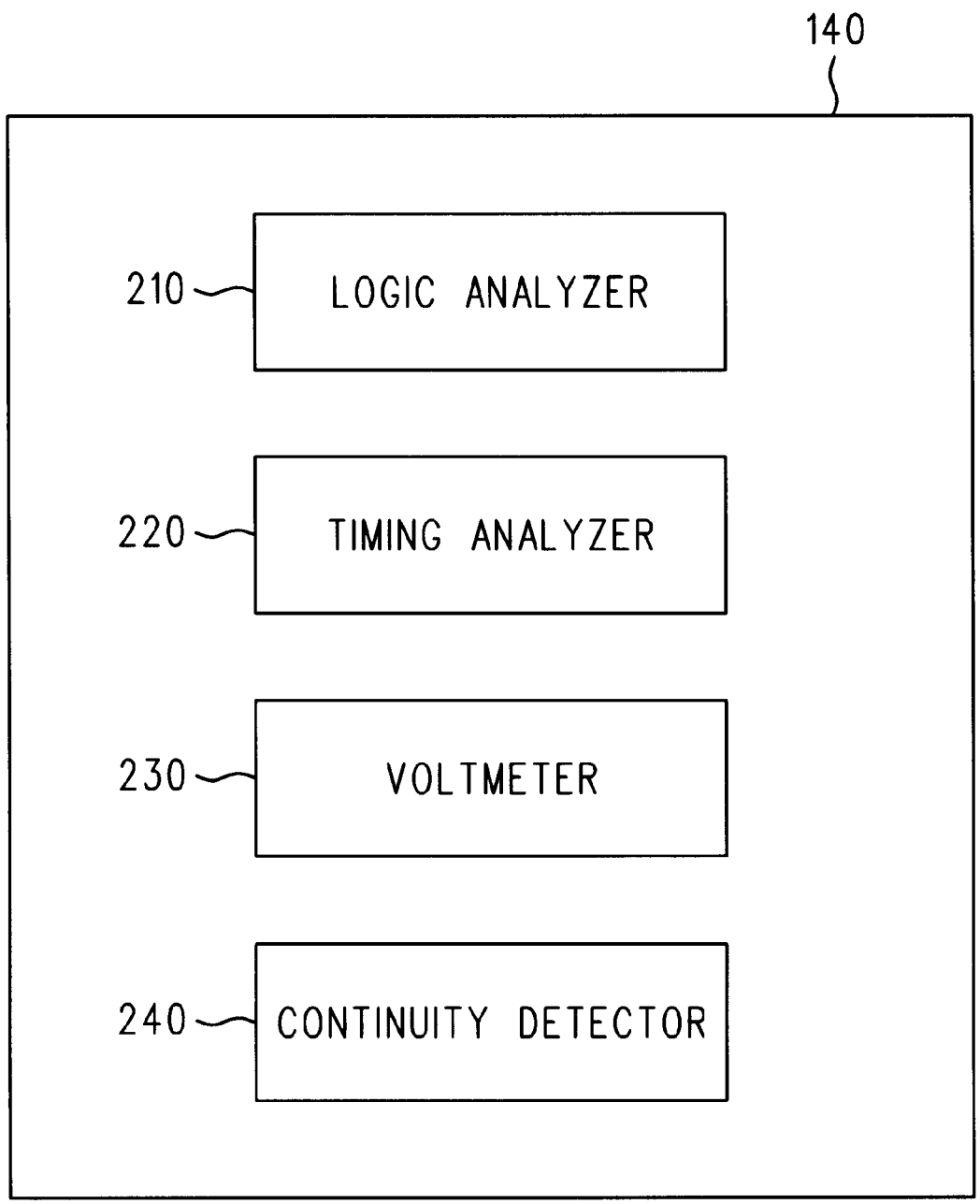
FIG. 2 shows a block diagram of the measurement hardware.

FIG. 2 shows a block diagram of the measurement hardware. Included in the present invention are a logic analyzer 210 (or "logic monitor"), a timing analyzer 220, a voltmeter 230 and a continuity detector 240. All of the measurement hardware is available from a single probe port channel (channel 1). From channel 1, an end-user may capture and examine a logic signal at a particular point in the circuit under test, as well as the voltage and frequency which are both continuously updated. The timing diagram that is displayed shows the captured data for channel 1 as high (logic 1), low (logic 0) or tristate. A feature of the present invention is that the system 100 provides simultaneous acquisition and display of multiple measurements in both graphic and numeric formats. Additional probe ports are also provided so that the end-user may capture and examine a plurality of circuit sections at the same time.

Figure 3:
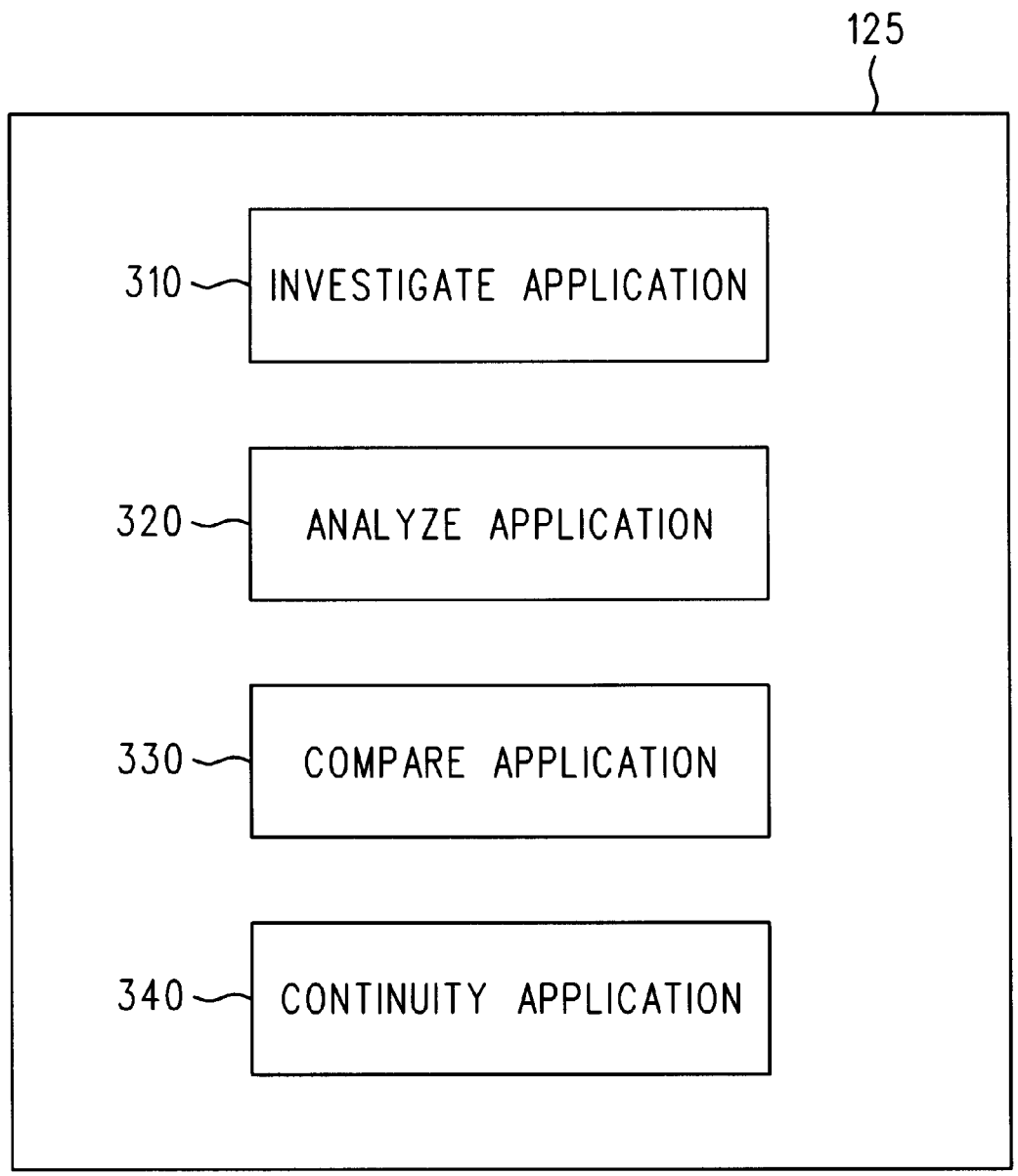
FIG. 3 shows a block diagram of the software applications according to the present invention.

FIG. 3 shows a block diagram of the software applications according to the present invention. Included in the present invention are an investigate application 310, an analyze application 320, a compare application 330 and a continuity application 340. Using the investigate application 310, the end-user may capture and examine any single point within the circuit under test. The investigate application 310 also permits the end-user to examine the circuit under test for open conditions, as will be discussed more fully below.

Using the analyze application 320, the end-user may capture and examine multiple signals from the same circuit utilizing up to three probe port channels. Additionally, complex trigger combinations may be set for the three channels simultaneously. Using the compare application 330, an end-user may compare a waveform to a known "good" waveform. The display mechanism 132 will show the reference waveform the compared waveform and the differences between the two. Using the continuity application 340, an end-user may examine whether the circuit under test is open or shorted, as well as measure resistance.

Figure 4:
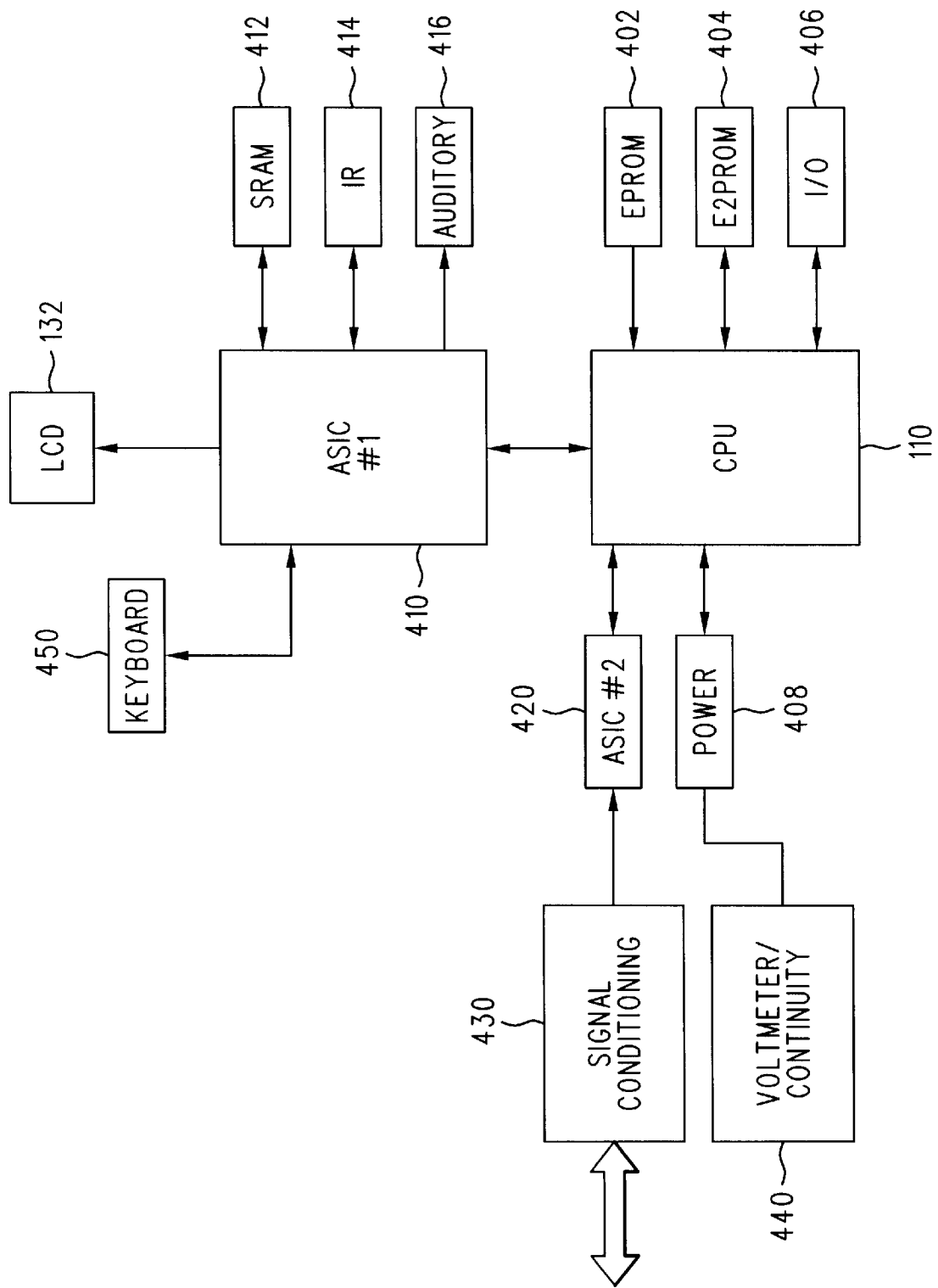
FIG. 4 shows a block diagram of the present system.

FIG. 4 shows a block diagram of the present invention. A CPU 110 is connected to a first ASIC 410. An EPROM 402, an EEPROM 404 and an input/output interface are also connected to the CPU 110. A second ASIC 420 is connected to the CPU 110 and is disposed between the CPU 110 and a signal conditioning block 430 and a voltmeter 440. Connected to the first ASIC 410 is an SRAM 412, a serial infrared port 414 and an auditory block 416. The keyboard 134 and LCD 132 are connected to the first ASIC 410.

The primary function of the first ASIC 410 is to generate clock, data and address control signals for the interface between the CPU 110 and the LCD 132. Essentially, the first ASIC 410 uses display data from the CPU 110 to create the requisite clocks, and row and column data signals to drive the LCD 132. The first ASIC 410 also acts as a glue logic collection point for other I/O functions, interfacing between the CPU 110 and the SRAM 412. ASIC 410 also buffers and decodes the user keyboard 134, it drives the audible and visual annunciators 416 and drives the serial infrared port 414.

Figure 5:
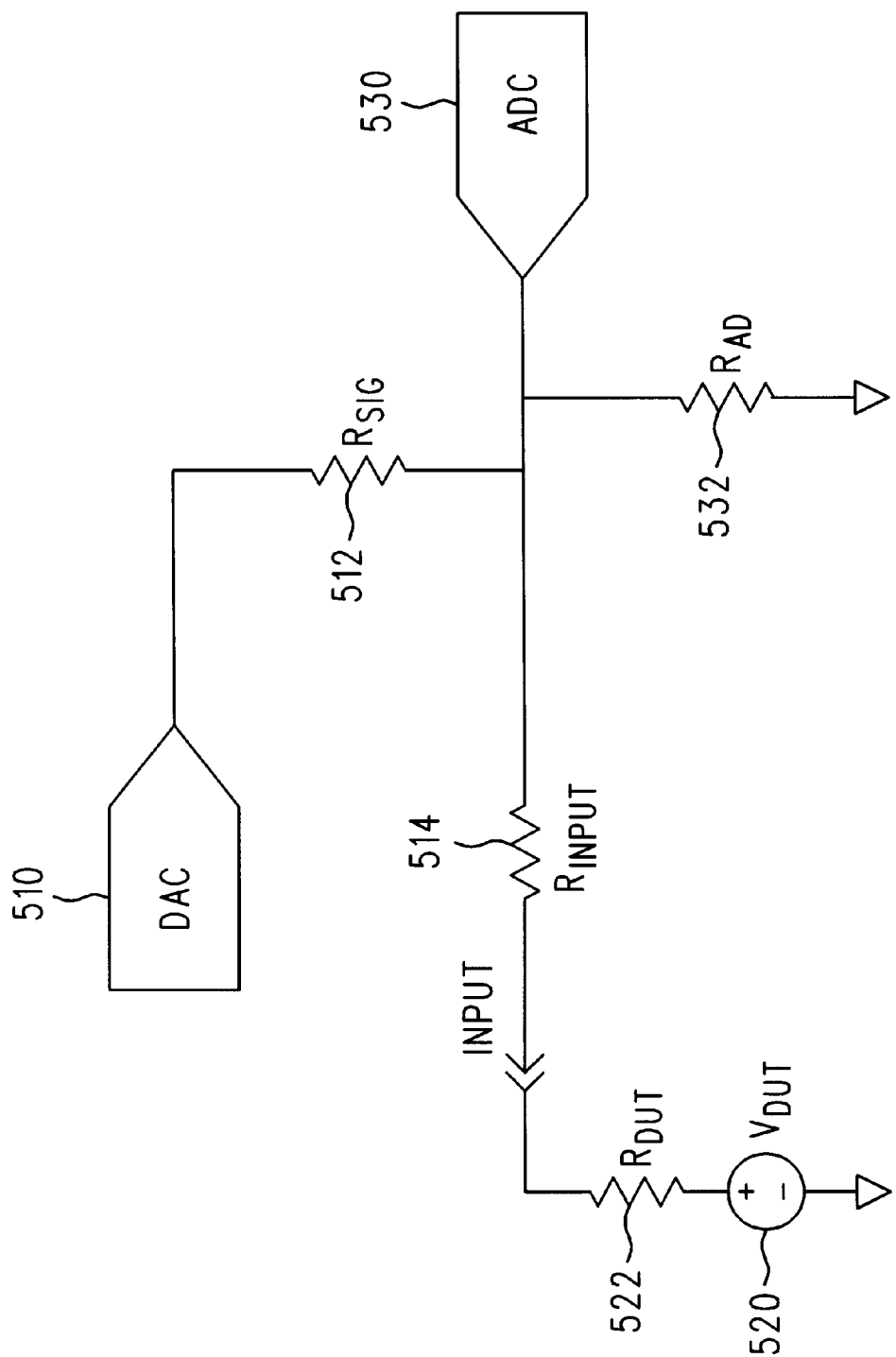
FIG. 5 shows a simplified circuit diagram for detecting open circuits with a single probe.

FIG. 5 shows a simplified circuit diagram for detecting open circuits with a single probe. Basically, if the input to the measurement system is open, which is equivalent to $R_{dut}$ 522 being infinite, the measured voltage at the analog-to-digital converter (ADC) 530 is controlled solely by the signal generated by the digital-to-analog converter (DAC) 510 and resistors $R_{sig}$ 512 and $R_{ad}$ 532. The DAC 510 is dithered a small amount sufficient to be measured by the ADC 530 while not significantly impacting the measurement system, for example, below 1 count in the output display of the measurement system.

If there is a load on the input to the measurement system, then $R_{dut}$ 522 can be modeled as some finite value. This causes the signal from the DAC 510 that is measured by the ADC 530 to be attenuated by the additional loading of $R_{dut}$ 522 and $R_{input}$ 514. At some predetermined threshold of attenuation, the input is no longer considered open. In another preferred embodiment, the DAC 510 can be replaced by a signal generator.

Figure 6:
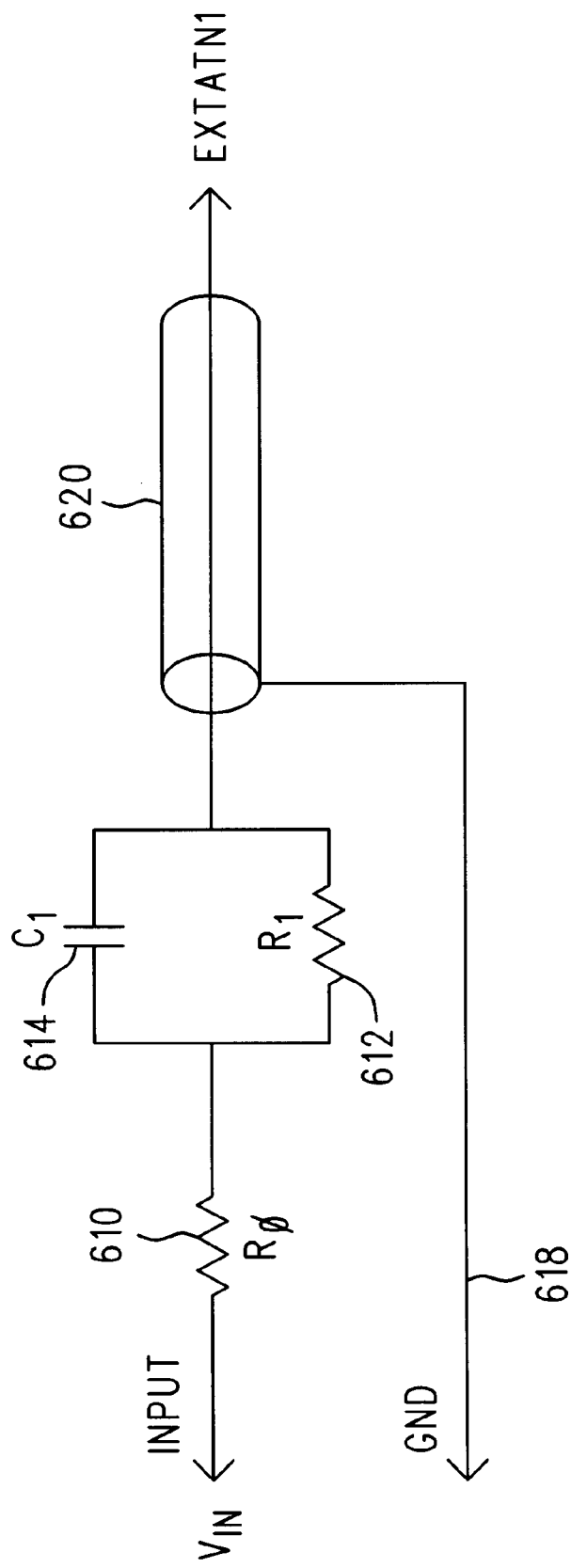
FIG. 6 shows a circuit diagram of the probe according to the present invention.

FIG. 6 shows a simple circuit diagram of the probe according to the present invention. The input signal is transmitted to the device (not shown) through $R_0$ 610. The first end of $R_0$ 610 is connected to the probe tip, while the second end of the $R_0$ 610 is connected to $R_1$ 612 and $C_1$ 614, which are connected in parallel. A coaxial cable 620 is then connected to the device. Cable 620 provides the necessary grounding 618 for the probe. An external attenuation signal, EXTATN1, is then brought into the device. In a preferred embodiment, $R_0$ 616 is 178 ohms, $R_1$ 612 is 787k ohms and $C_1$ 614 is 12 picofarads.

Figure 7:
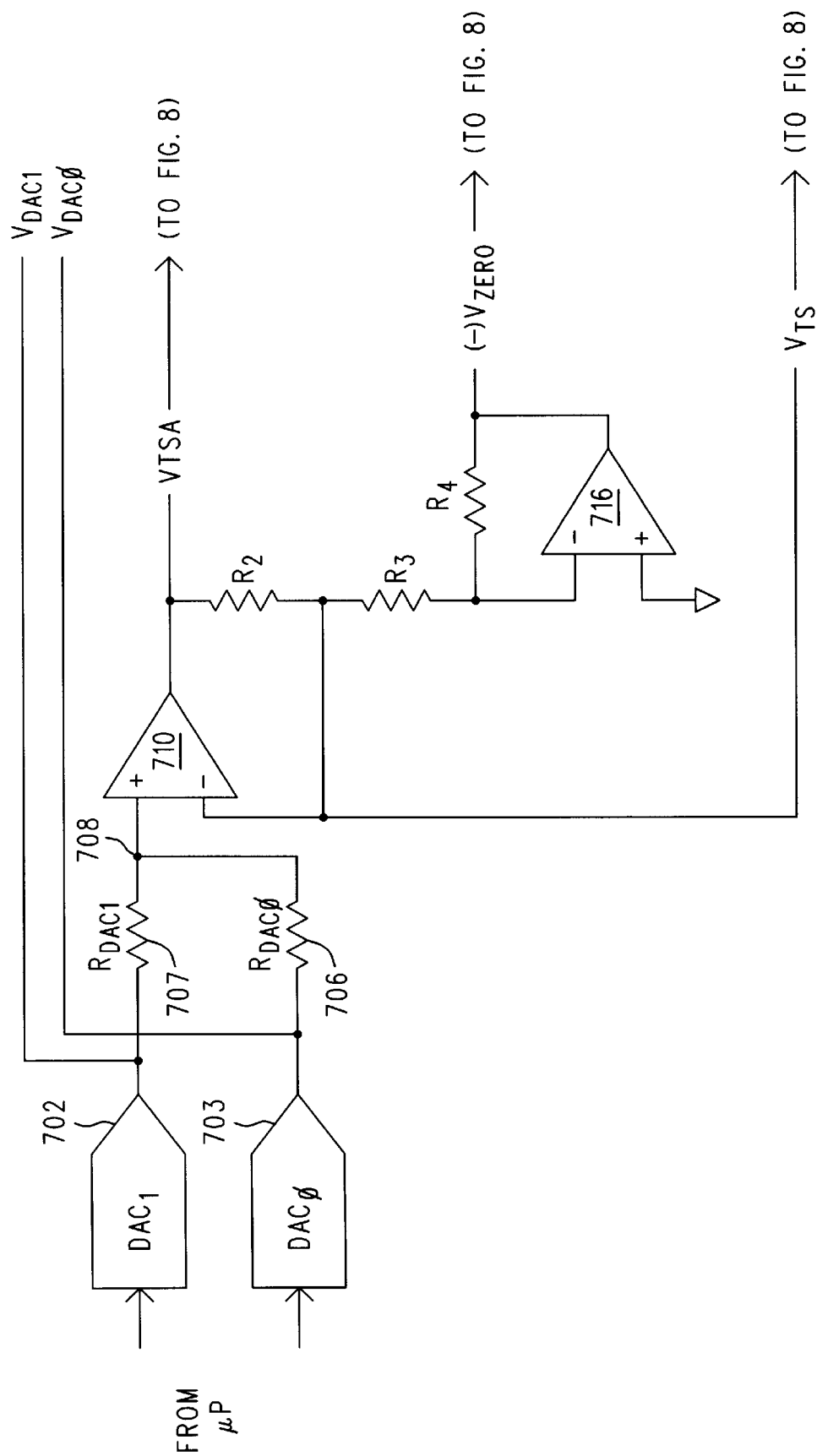
FIG. 7 shows the first portion of a circuit diagram of the system to detect open circuits according to the present invention.

FIG. 7 shows the first portion of the system to detect open circuits. Two digital-to-analog converters (DACs) 702,703, generate the tri-state voltage (VTS) to feed through the system. Resistor 707 is connected to the output of DAC 702, while resistor 706 is connected to the output of DAC 703. These resistors 707, 706 are connected at node A 708. The voltage at node A 708 is approximately $V_{WTS}$. $V_{WTS}$ is fed into amplifier 710. The output of amplifier 710 is fed back into the inverting input of amplifier 710 through resistor $R_2$ 712; this line is also provided the analog-to-digital converter (ADC) (see FIG. 8). Additionally, the output from amplifier 710 is fed onto the next stage of the system (see FIG. 8) and the voltage on this line is approximately 1.25*$V_{WTS}$, nominally called VTSA. The first end of resistor $R_3$ 714 is connected to the second end of $R_2$ 712. The second end of $R_3$ 714 is connected to the inverting input of amplifier 716, with the non-inverting input of amplifier 716 connected to ground. $R_4$ 718 is disposed between $R_3$ 714 and the output of amplifier 716. The output of amplifier 716 is $V_{zero}$, or the cancellation voltage for the system.

Figure 8:
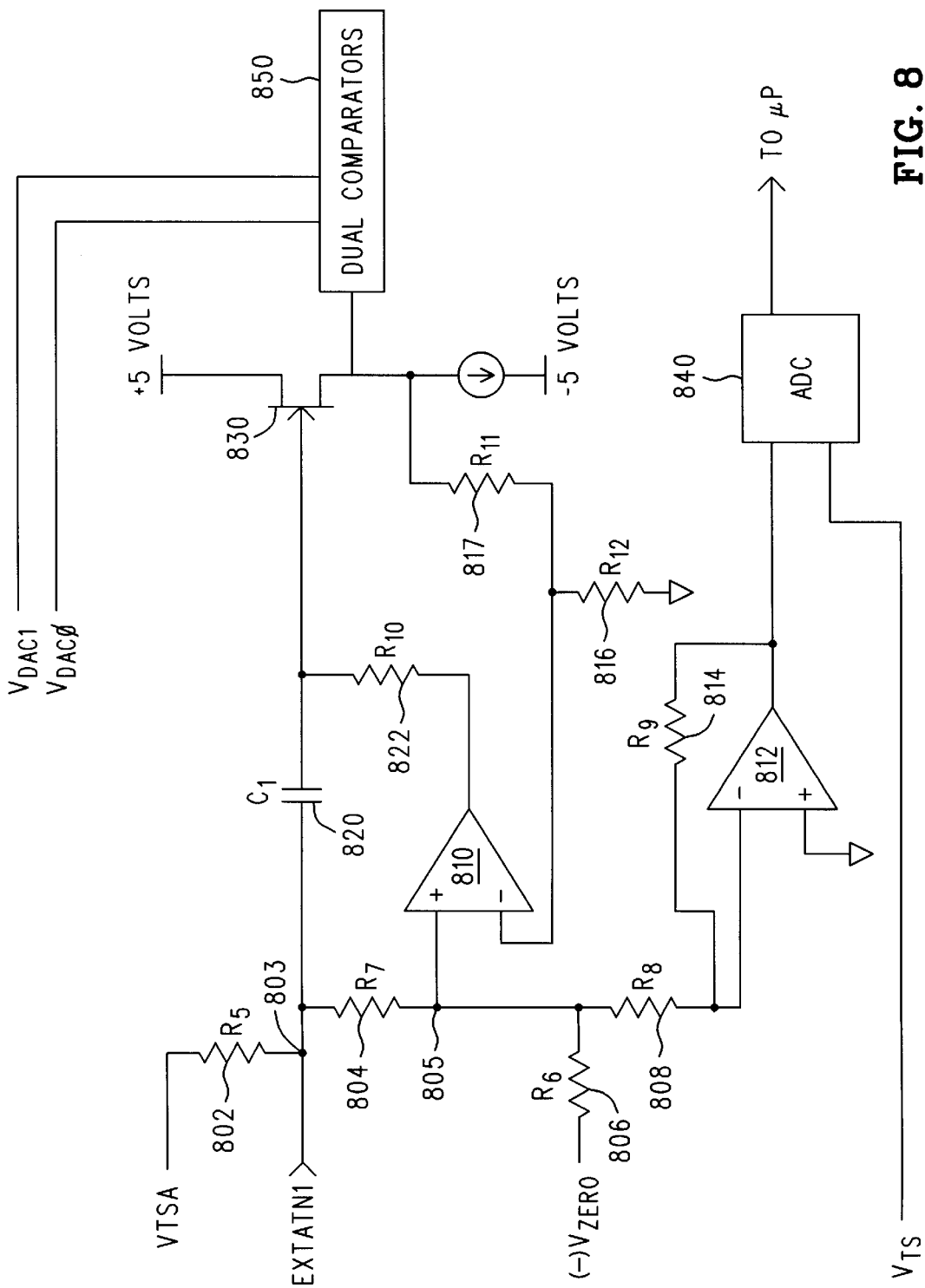
FIG. 8 shows the second portion of the circuit diagram of the system in FIG. 7.

FIG. 8 shows a second portion of the system to detect open circuits. The external attenuation signal, EXTATN1, enters this circuit through the measurement path to node 803 where it is summed to VTSA which is dropped across $R_5$ 802. At node 803, the voltage is equal to the external or DUT tri-state voltage, $V_{WTS}$; when the DUT is disconnected, i.e., the input is floating. The AC component of the signal on node 803 is passed through capacitor $C_1$ 820 to FET 830. The DC component of the signal on node 803 is fed across $R_7$ 804 to the non-inverting input of amplifier 810, where it is summed with the nulling voltage, $V_{zero}$, which is fed in by $R_6$ 806. The remaining signal at node 805 injects a current through $R_8$ 808 into the virtual ground at the inverting input of amplifier 812. This current is converted to a voltage by $R_9$ and amplifier 812. This voltage is measured by ADC 840. The DC component of the voltage at node 805 is also brought out from the amplifier 810, across $R_{10}$ 822, to FET 830. Amplifier 810 senses the voltage at node 831 as it is attenuated by $R_{11}$ and $R_{12}$ and presented to the inverting input of amplifier 810. Amplifier 810 thus causes the DC component of the voltage at node 803 to be reproduced at node 831.

Table 1 below shows the preferred values of the various resistors and capacitors of FIGS. 7 and 8.

TABLE 1

Preferred Values of Resistors and Capacitors for FIGS. 7 and 8

| Item | Value |
| --- | --- |
| $R_{DAC1}$ | 100 k ohms |
| $R_{DAC0}$ | 100 k ohms |
| $R_2$ | 324 k ohms |
| $R_3$ | 59 k ohms |
| $R_4$ | 117 k ohms |
| $R_5$ | 249 k ohms |
| $R_6$ | 392 k ohms |
| $R_7$ | 787 k ohms |
| $R_8$ | 392 k ohms |
| $R_9$ | 332.7 k ohms |
| $R_{10}$ | 4.7M ohms |
| $R_{11}$ | 787 k ohms |
| $R_{12}$ | 200 k ohms |
| $C_1$ | 680 picofarads |

Figure 9:
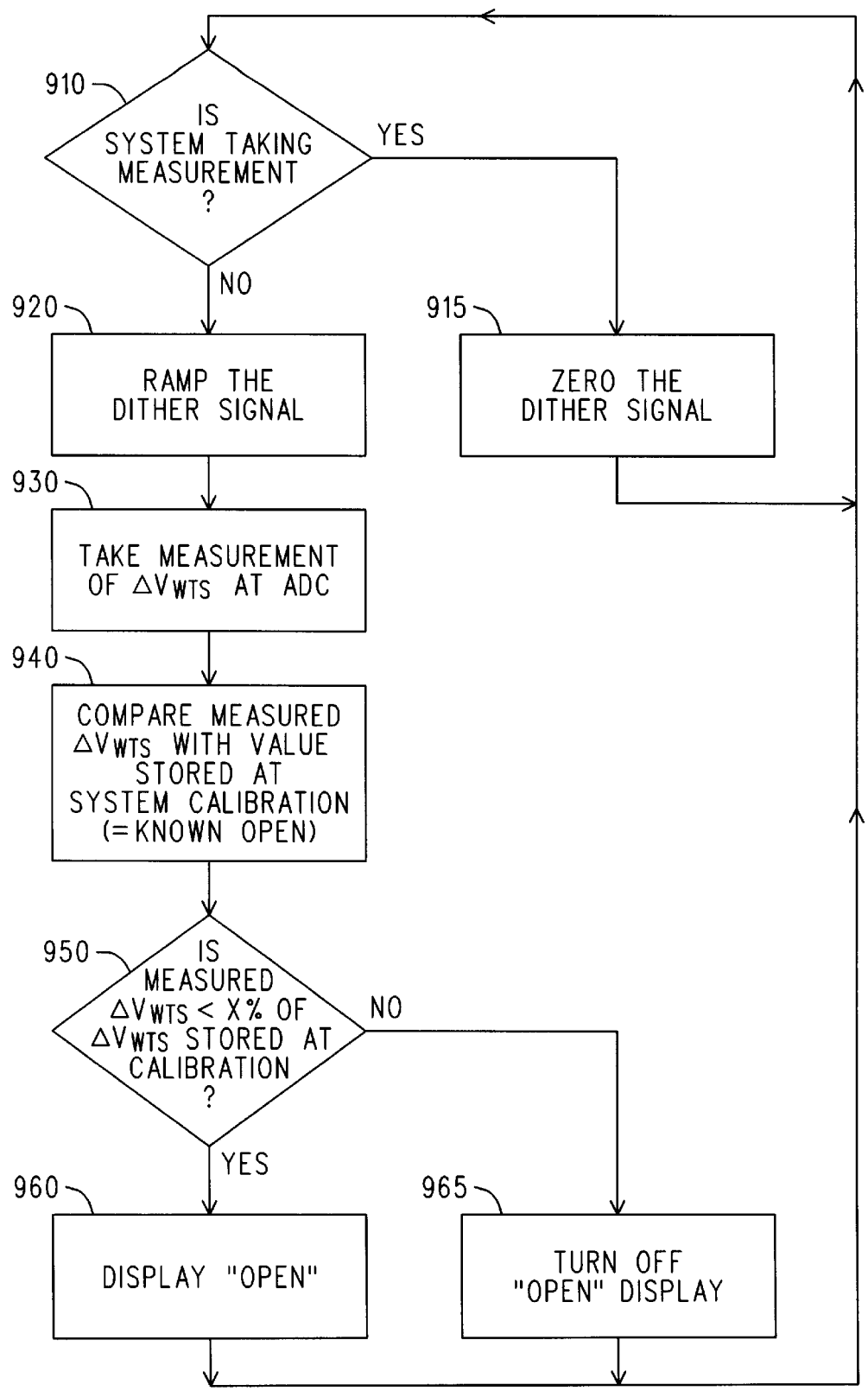
FIG. 9 shows a flow diagram of the method for detecting open circuits according to the present invention.

FIG. 9 shows a block diagram of the present method for detecting open circuits. Basically, the method involves introducing a known signal into the measurement system and comparing how that known signal is attenuated to determine whether the system is open. If the measured signal looks like the known signal, then there is no attenuation added by the probe and, thus, the system is open.

Referring now to FIG. 9, decisional block 910 determines whether a measurement is being taken. If there is a measurement being taken, essentially no action is taken. This is to ensure that we get the best possible measurement. Control is then passed to block 915 which zeroes out the dither signal before returning control back to decisional block 910.

If no measurement is being taken, control is passed to block 920 to dither the DACs (item 510 in FIG. 5, or items 702 and 703 in FIG. 7). Block 930 takes the measurement of $\Delta_{wts}$ (the difference 'world tri-state voltage') at the ADC (item 530 in FIG. 5, or item 840 in FIG. 8).

Block 940 compares the measured $\Delta V_{wts}$ acquired in block 930 with the calibrated $\Delta V_{wts}$. Decisional block 950 determines whether calibrated $\Delta V_{wts}$ is equal to some predetermined percentage of the measured $\Delta V_{wts}$. In one preferred embodiment, the percentage is 50%. In another preferred embodiment, the percentage is greater than 50% and less than 90%. In yet another preferred embodiment, the percentage is 75%.

If the measured $\Delta V_{wts}$ is less than some predetermined percentage of the calibrated $\Delta V_{wts}$, then we can say with certainty that the probe is not attenuating the fknown signal (i.e., the dithering of the DACs) and control is passed to block 960 which displays 'OPEN'. If decisional block 950 determines that $\Delta V_{wts}$ is not equal to the predetermined percentage of the measured $\Delta V_{wts}$, then control is passed to block 965 which turns off the OPEN display before passing control back to the top of FIG. 9 to continue checking for an open condition.

Figure 10A:
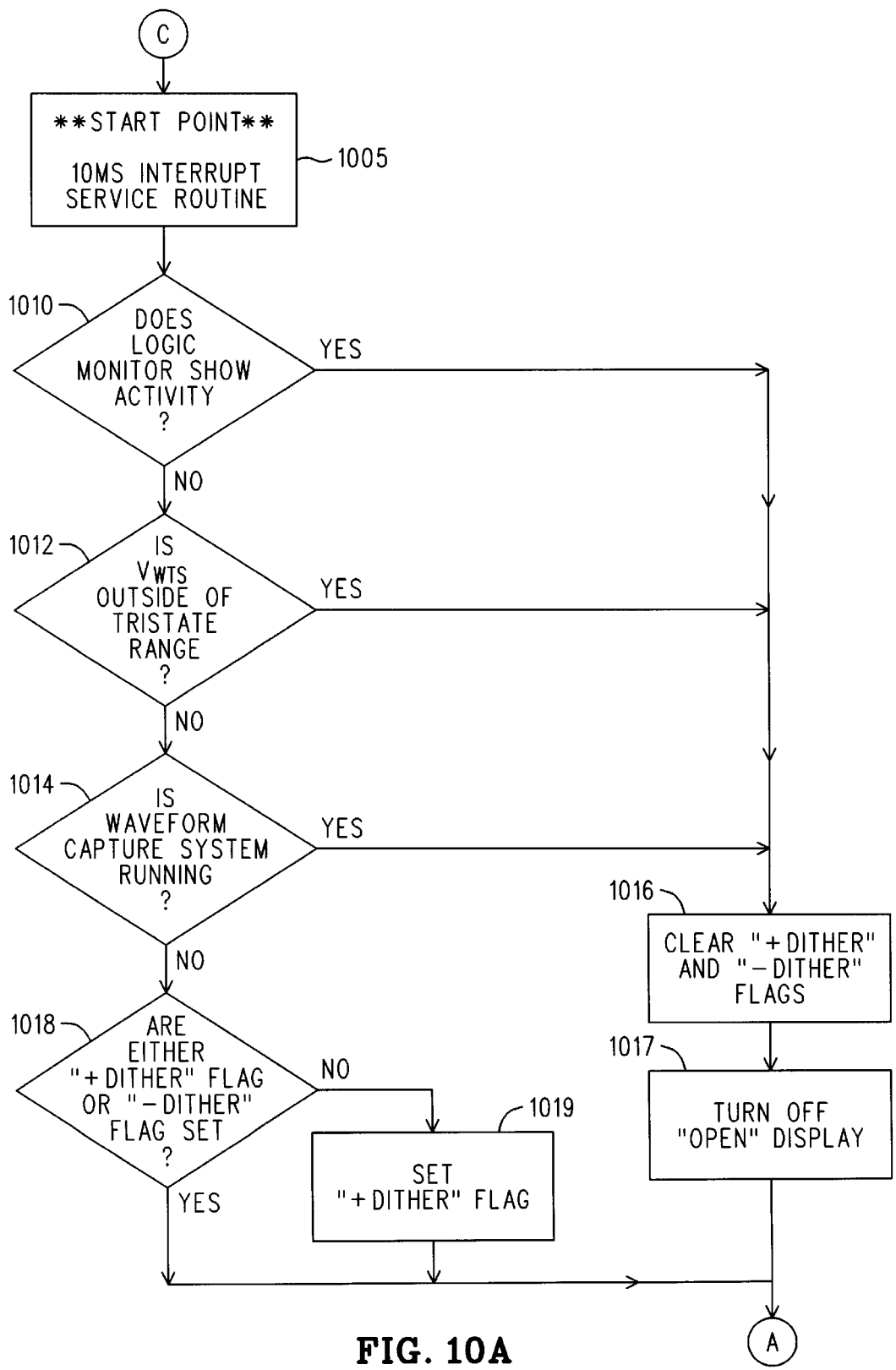
FIGS. 10a, 10b and 10c show a more detailed flow diagram of the present method.
Figure 10B:
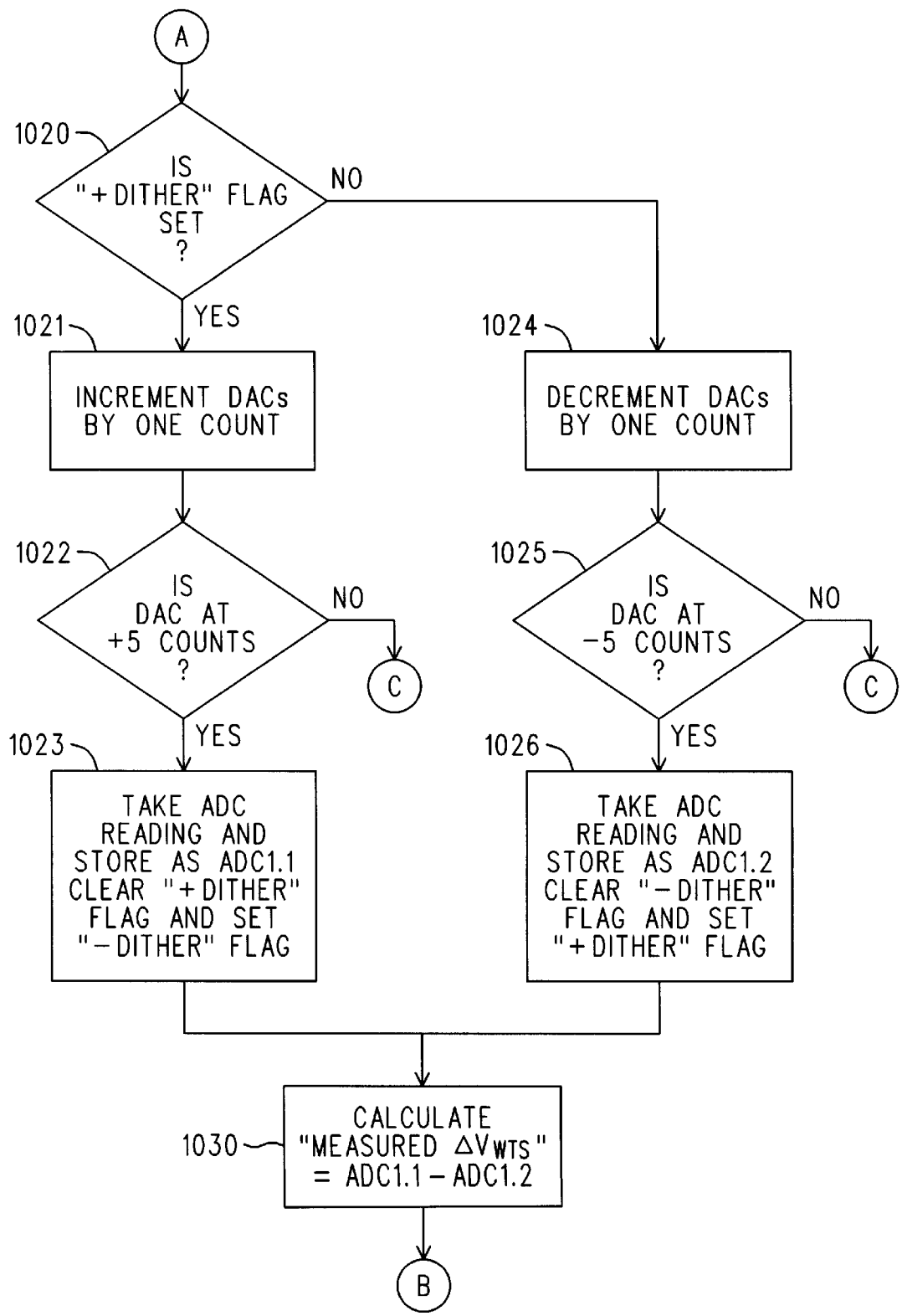
Figure 10C:
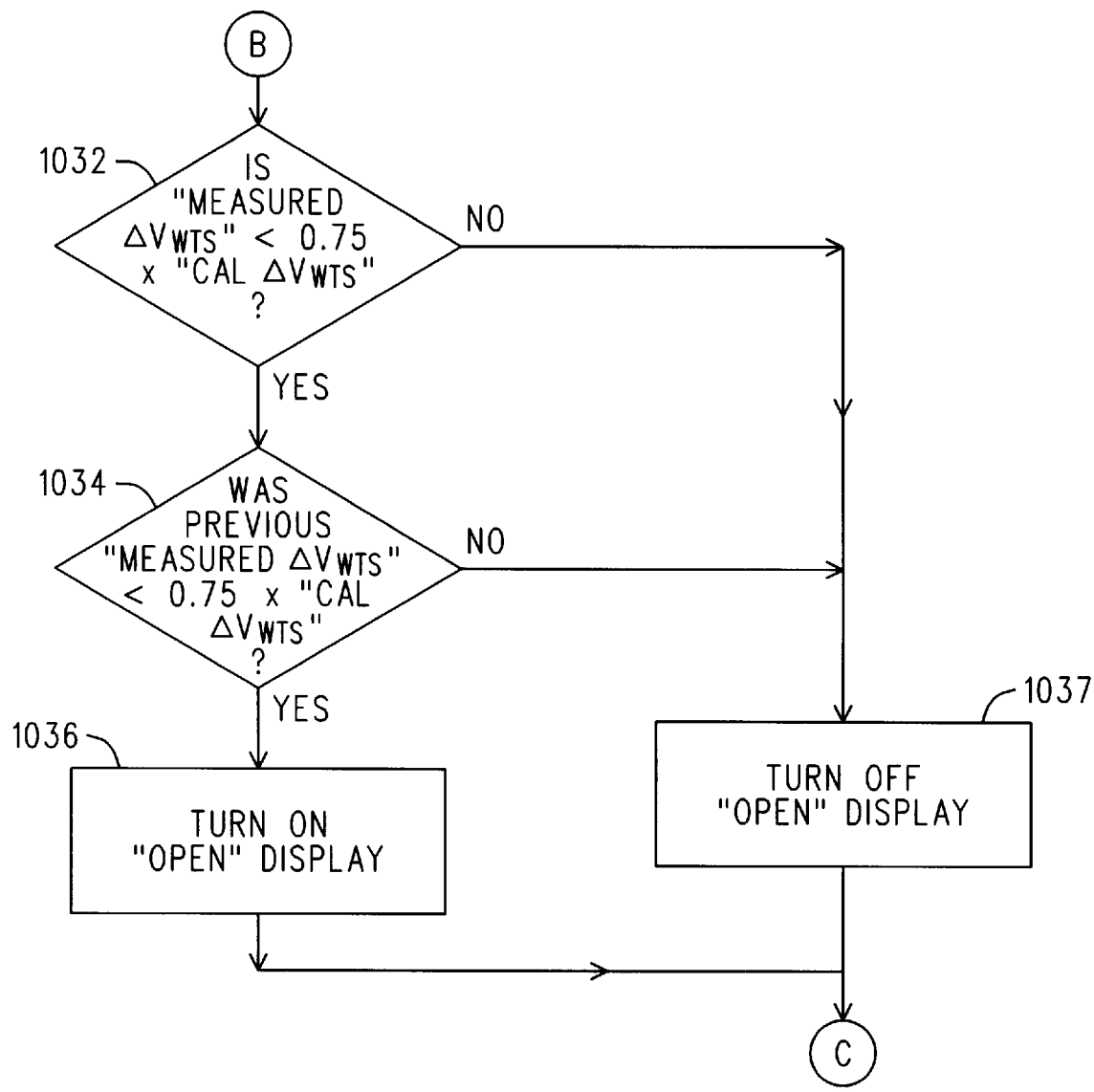

FIGS. 10a, 10b and 10c show amore detailed flow diagram of the present method for detecting open circuits. Decisional block 1005 is the starting point for the present method of detecting open circuits, which allows for a 10 ms interrupt service routine. Decisional block 1010 determines whether the logic monitor is running. If the logic monitor is running, then the system is taking a measurement (i.e., the circuit cannot be open) and there's no need to continue; control is passed to block 1016 to clear the +DITHER and –DITHER flags. Block 1017 then turns off the 'OPEN' display on the LCD (item 132 in FIGS. 1 and 4) before continuing with the method.

If the logic monitor is not running, then control is passed to decisional block 1012 to determine whether $V_{wts}$ is outside the tri-state range (i.e., if its either high or low). Again, if $V_{wts}$ is outside the tri-state range, then the circuit is not open, control is passed to block 1016. If $V_{wts}$ is within the tri-state range, control is passed to decisional block 1014 to determine whether the device is in "run" mode (i.e., is the waveform capture system running?). If the device is in run mode, which indicates that a measurement will be taken, control is passed to block 1016.

If the device is not in run mode, control is passed to decisional block 1018 to determine if either the +DITHER or –DITHER flag has been set. If the +DITHER flag has not been set, control is passed to block 1019 to set the +DITHER flag before continuing on with the present method. If either flag has been set, decisional block 1018 passes control to decisional block 1020 to determine whether the +DITHER flag has been set. If the +DITHER flag is set, control is passed to block 1021 if the +DITHER flag has not been set, that means by default that the –DITHER flag has been set and control is passed to block 1024.

Block 1021 increments the DACs by one count (i.e., the DACs are dithered upwards). Decisional block 1022 then determines whether the DACs are at +5 counts. If not, control is returned to the starting point of the present method to provide another 10 ms interrupt service routine and continue checking the system. Recall that if the system is taking a measurement of any kind, we halt the dithering process. This is done to ensure we devote the systems resources to making the best possible measurement. If the DACs have reached +5 counts, control is passed to block 1023 to take an ADC reading, store this as 'ADC1.1', clear the +DITHER flag and set the –DITHER flag before moving on.

Block 1024 decrements the DACs by one count (i.e., the DACs are dithered downwards). Decisional block 1025 then determines whether the DACs are at –5 counts. If not, control is returned to the starting point of the present method to provide another 10 ms interrupt service routine and check the system for any measurement activity. If the DACs have reached –5 counts, control is passed to block 1026 to take an before moving on.

Block 1030 calculates "measured $\Delta V_{wts}$" as ADC1.1 minus ADC1.2. Referring now to FIG. 10c, decisional block determines whether measured $\Delta V_{wts}$ is less than 75% of calibrated $\Delta V_{wts}$. If it is not, then we have determined that the circuit is not open and control is passed to block 1037 to turn off the 'OPEN' display. If $\Delta V_{wts}$ is less than 75% of calibrated $\Delta V_{wts}$, then control is passed to decisional block 1034.

Decisional block 1034 determines whether the previously measured $\Delta V_{wts}$ satisfied the conditions of decisional block 1032. If not, control is passed to block 1037. If yes (i.e., there have been two consecutive cycles of the measured $\Delta V_{wts}$ being less than 75% of the calibrated $\Delta V_{wts}$), then we can say with confidence that the circuit under test is open and block 1036 turns on the 'OPEN' display.

Figure 11:
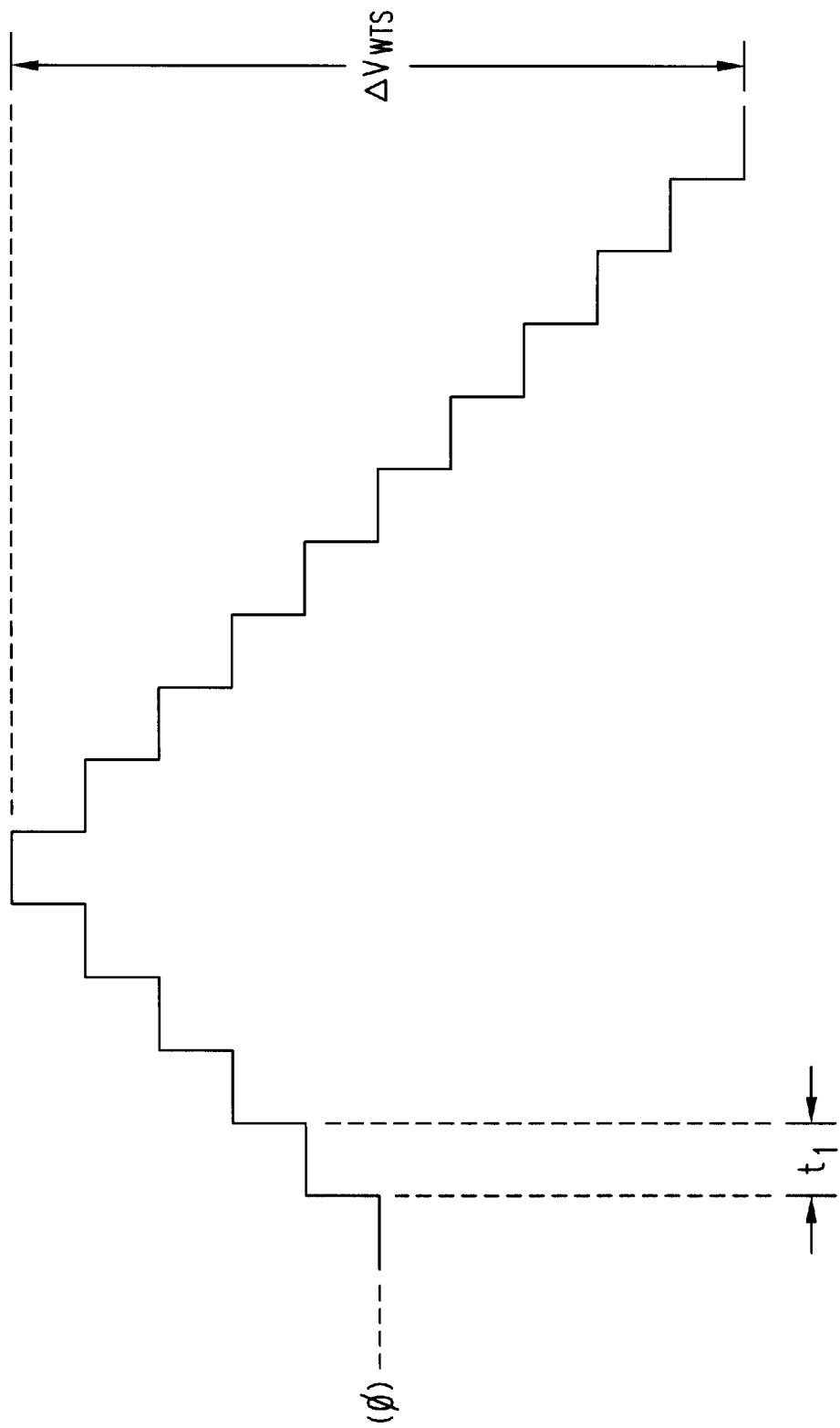
FIG. 11 shows a representative dithering signal generated by the DACs according to the present invention.

FIG. 11 shows a representative dithering signal according to the present invention. In a preferred embodiment, $t_1$ is equal to 2 milliseconds.

While the present invention has been illustrated and described in connection with the preferred embodiments, it is not to be limited to the particular structures shown. It should be understood by those skilled in the art that various changes and modifications may be made within the purview of the appended claims without departing from the true scope and spirit of the invention in its broader aspects.

What is claimed is:

1. An apparatus for detecting open circuits, the apparatus comprising:

first and second digital-to-analog converters (DACs), the first and second DACs each have an input and an output;

a first amplifier, the first amplifier having a first positive input, a first negative input and a first output, the first positive input electrically connected to the first and second DAC outputs, the first amplifier generates an attenuated tri-state voltage (VTSA) at the first output, the voltage at the first negative input is equal to a tri-state voltage ($V_{wts}$);

a second amplifier, the second amplifier having a second negative input and a second output, the second negative input electrically connected to the output of the first amplifier, the second amplifier generates a cancellation voltage ($V_{zero}$) at the second output;

a node, electrically connected to first output and a measurement line, the measurement line transmits an external attenuation signal (EXTANT1), the voltage at the node is equal to the summation of VTSA and EXTANT1;

a third amplifier, the third amplifier having a third positive input and a third output, the third positive input electrically connected to the node;

a fourth amplifier, the fourth amplifier having a fourth negative input and a fourth output, the fourth negative input electrically connected to $V_{zero}$;

and an analog-to-digital converter (ADC), the ADC having a first and second inputs and an output, the first ADC input electrically connected to the fourth output, the second ADC input electrically connected to the first negative input.

2. The apparatus of claim 1, wherein the inputs of the DACs are electrically connected to a microprocessor, the microprocessor, in conjunction with the DACs, generates a tri-state voltage that is fed through the apparatus.

3. The apparatus of claim 2, wherein the ADC compares $V_{wts}$ with a known signal, the known signal is predetermined.

* * * * *

UNITED STATES PATENT AND TRADEMARK OFFICE
CERTIFICATE OF CORRECTION

PATENT NO. : 5,942,982
DATED : August 24, 1999
INVENTOR(S) : Noble et al.

It is certified that error appears in the above-identified patent and that said Letters Patent is hereby corrected as shown below:

<u>Title page,</u>
Item [75], please add the following name and address of the third inventor:
-- Ronald L. Swerlein, Longmont, Colo. --

Signed and Sealed this

Twenty-sixth Day of November, 2002

*Attest:*

*Attesting Officer*

JAMES E. ROGAN
*Director of the United States Patent and Trademark Office*